United States Patent [19]

Matsuo et al.

[11] Patent Number: 5,134,583
[45] Date of Patent: Jul. 28, 1992

[54] NONVOLATILE SEMICONDUCTOR MEMORY DEVICE HAVING REDUNDANT DATA LINES AND PAGE MODE PROGRAMMING

[75] Inventors: Akinori Matsuo, Higashiyamato; Masashi Watanabe, Kokubunji; Masashi Wada; Takeshi Wada, both of Akishima; Yasuhiro Nakamura, Kodaira, all of Japan

[73] Assignees: Hitachi, Ltd.; Hitachi VLSI Engineering Corp., both of Tokyo, Japan

[21] Appl. No.: 440,323

[22] Filed: Nov. 22, 1989

[30] Foreign Application Priority Data

Nov. 22, 1988 [JP] Japan ................................ 63-295173

[51] Int. Cl.$^5$ .............................................. G11C 00/00
[52] U.S. Cl. ................................ 365/200; 365/230.03; 365/189.05; 365/238.5
[58] Field of Search ................... 365/200, 230.03, 185, 365/238.5, 189.04, 189.05

[56] References Cited

U.S. PATENT DOCUMENTS

| | | | |
|---|---|---|---|
| 4,599,709 | 7/1986 | Clemons | 365/238.5 |
| 4,601,019 | 7/1986 | Shah et al. | 365/200 |
| 4,788,665 | 11/1988 | Fukuda | 365/230.06 |
| 4,837,747 | 6/1989 | Dosaka et al. | 371/10.3 |
| 4,910,710 | 3/1990 | Kobatake | 365/189.03 |

FOREIGN PATENT DOCUMENTS

0134390 10/1981 Japan ................................ 365/238.5
152592 8/1984 Japan .

*Primary Examiner*—Glenn Gossage
*Attorney, Agent, or Firm*—Antonelli, Terry, Stout & Kraus

[57] ABSTRACT

A semiconductor memory device has a plurality of memory blocks, each block including a matrix arrangement of a plurality of nonvolatile memory elements. The device is also provided with at least one redundant data line which is selectively employed in place of a defective data line associated with a defective address in a memory block. The data lines corresponding to the respective memory blocks are selectively coupled to corresponding ones of first common data lines by a Y selector circuit in accordance with outputs of a first Y decoder, while a redundant data line is controllably coupled to a redundant common data line by a redundant selector circuit in accordance with an output of a redundant decoder. A plurality of data latch circuits are provided for transmitting therethrough write information data in accordance with outputs of a second Y decoder and a second redundant decoder, each one of the plurality of data latch circuits being paired with a respective one of a plurality of write amplifiers which transmit the write signals to the common data lines and redundant common data line. Therefore, of the plurality of data lines being addressed in the plurality of memory blocks, only a defective data line which corresponds to a defective address is replaced with a respective redundant data line.

32 Claims, 7 Drawing Sheets

(DECODER FOR PAGE PROGRAM)

(DECODER FOR NORMAL PROGRAM)

FIG. 4

(DECODER FOR PAGE PROGRAM)

(DECODER FOR NORMAL PROGRAM)

NONVOLATILE SEMICONDUCTOR MEMORY DEVICE HAVING REDUNDANT DATA LINES AND PAGE MODE PROGRAMMING

CROSS-REFERENCE TO RELATED APPLICATION

A co-pending related U.S. application Ser. No. 07/741,224, has been filed on Aug. 5, 1991, which is a continuation of Ser. No. 07/440,338, (now abandoned), entitled "A Semiconductor Memory Device Having an Automatically Activated Verify Function Capability," commonly assigned, and filed on even date herewith.

BACKGROUND OF THE INVENTION

1. Field of the Invention

This invention relates to a semiconductor memory device and, more particularly, to techniques which are effective when utilized for, e.g., an EPROM (erasable and programmable read only memory) associated with a nonvolatile semiconductor memory device into which information can be electrically written.

2. Description of Related Subject Matter

An example of an EPROM into which information data are simultaneously written, such as, in the form of a plural-byte information data or in the form of a plural-word unit of information data, is disclosed in Japanese Patent Application publication No. 59-152592, laid-open on Aug. 31, 1984.

Owing to the progress of semiconductor integrated circuit technology, the microfabrication of devices has been achieved, and the direction of development continues to be towards enlarging the storage capacity, that is the storage capability of such memory devices even further. With such increases in the storage capacity of such memory devices, remedying defects associated therewith has become indispensable in enhancing the usable capacity or portion of the device or in the available percentages of the products being manufactured for use. Accordingly, redundant (spare) data lines for remedying defects should to be laid-out or provided in the EPROM which is, furthermore, characterized as having the function of simultaneously writing a plurality of bytes or words as stated above, namely, a so-called "page program mode." The aforementioned EPROM, however, adopts a type of construction in which write information data items corresponding to the plurality of bytes or words are held in latch circuits through column switches and write signals are collectively transmitted to data lines for the plurality of bytes or words in accordance with the information data items held. Therefore, when the redundant data lines are laid-out or provided in connection with such an EPROM for the writing of a plural-byte or plural-word information data type unit, there arises the problem that the area of the memory device must inevitably become enlarged. Moreover, when a function such as that of the page program mode, described above, is added, there, furthermore, arises the problem that the number of external terminals required for setting the mode must necessarily be increased.

SUMMARY OF THE PRESENT INVENTION

An object of this invention is to provide a semiconductor memory device which has both a page program function and a defective data line-remedying function while maintaining a high density of integration.

Another object of this invention is to provide a semiconductor memory device which is rendered multifunctional without increasing the number of control terminals.

An exemplifying embodiment featuring a typifying aspect of the present invention is briefly summarized below. Redundant data lines are provided in such a way in the semiconductor memory device, having a memory array formed as a plurality of memory blocks, that at least one redundant data line is associated with a corresponding one of the plurality of memory blocks. In each of the memory blocks nonvolatile memory elements are arranged as a matrix array of rows and columns of nonvolatile memory elements. Data lines of the respective memory blocks are selectively coupled to corresponding ones of first common data lines by a Y selector circuit in accordance with outputs of a first Y decoder, while a redundant data line is selectively coupled to a redundant common data line by a redundant selector circuit in accordance with an output of a redundant decoder. Moreover, a plurality of latch circuits are provided for temporarily storing (latching) and transmitting write information data items, received from a data input buffer, in accordance with outputs of a second Y decoder and a second redundant decoder. Each one of the plurality of latch circuits, furthermore, is paired with a respective one of a plurality of write amplifiers which, in turn, transmit write signals to the common data lines and the redundant common data line respectively corresponding thereto in accordance with stored information data items of respective latch circuits associated therewith.

According to a device implementing the above technique, at least one redundant data line is provided in the laid-out arrangement associated with the plurality of memory blocks, and a defective data line associated with a plurality of bits is replaced with the redundant data line, so that the page program function and the high density of integration can be realized.

The above and other objects and novel features of this invention will become apparent from the description of the exemplifying configurations described in this specification when read in conjunction with the accompanying drawings.

DESCRIPTION OF THE PREFERRED EMBODIMENTS

Figure 1:
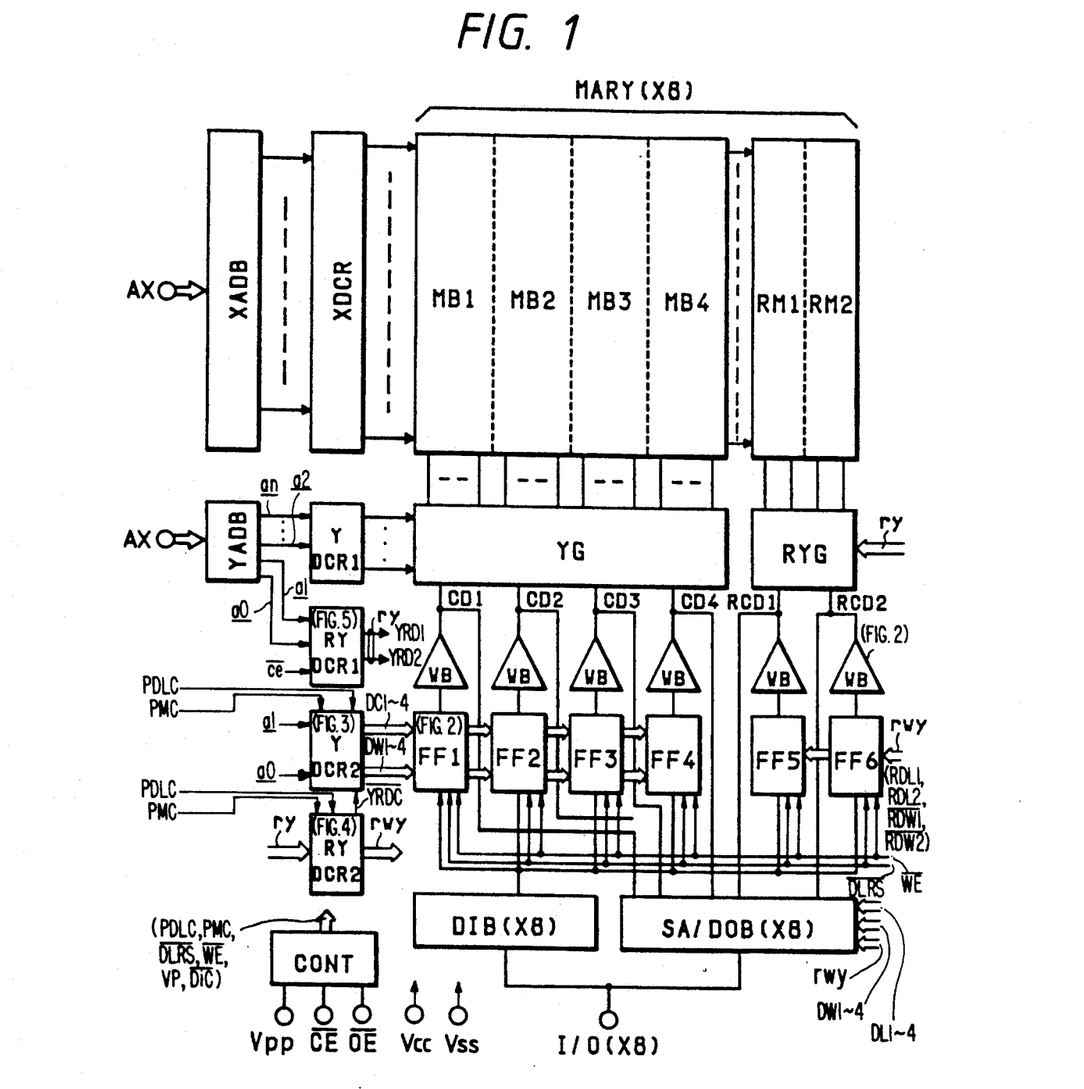
FIG. 1 is a block diagram showing an embodiment of an EPROM to which this invention is applied.

FIG. 1 shows a block diagram of an embodiment of an EPROM to which this invention is applied. Various circuit blocks in the figure are formed on a single semiconductor substrate such as of single-crystal silicon by known techniques for manufacturing semiconductor integrated circuits. In the figure, marks "o" indicate external terminals. An external terminal $V_{cc}$ serves to receive the power source voltage $V_{cc}$ of the circuitry and which is supplied to the various circuit blocks, while an external terminal $V_{ss}$ serves to receive the ground potential $V_{ss}$ of the circuitry and which is supplied to the various circuit blocks.

In the figure, a memory array MARY and input/output circuits associated therewith are shown in correspondence with 1 bit. Therefore, in a case where the entire EPROM is read out in a plural-bit information data type unit, such as with respect to an 8-bit unit, the memory arrays MARY and the input/output circuits are disposed in the form of a plurality of sets, such as 8 sets.

An EPROM which is provided with a plurality of sets of memory arrays and input/output circuits and which is capable of page programming is described in U.S. Pat. No. 4,788,665. Regarding the specific construction, etc., of the memory array and input/output circuits of this embodiment, attention is directed to the above-said patent which is herein incorporated by reference.

Although not specifically limited thereto, the memory array MARY presently disclosed is constituted by four memory blocks MB1-MB4 and two redundant blocks RM1-RM2. (With respect to an eight-bit unit discussed above, for example, the memory blocks constituting each memory array may be referred to as a group of memory blocks of the entire eight-bit set included in the plurality of memory blocks.) As in the EPROM disclosed in U.S. Pat. No. 4,788,665 mentioned above, each of the blocks is so constructed that nonvolatile memory elements which have a stacked gate structure of a control gate and a floating gate are arranged at the respective intersections between word lines and data lines, and that the control gates, drains and sources of the memory elements are respectively coupled to the word lines, the data lines and the ground potential ($V_{ss}$) point of the circuitry.

The word lines of the memory array MARY, which array is constituted by the four memory blocks MB1-MB4 and the two redundant blocks RM1-RM2, are selected by an X decoder circuit XDCR. The X decoder circuit XDCR operates to decode internal address signals provided by an address buffer XADB which receives address signals (external address signals), also referred to as the X-group address signals AX, and the X decoder circuit XDCR operates to select one word line from among the plurality of word lines within the memory array MARY. In the case where there are disposed memory arrays MARY in the form of a plurality of sets, as stated above, the address buffer XADB and X decoder circuit XDCR for the X-group selecting operation are shared by the plurality of sets of memory arrays MARY in the same manner as in the EPROM disclosed in the above-mentioned U.S. Pat. No. 4,788,665.

Upon receiving select signals formed by the first Y decoder circuit YDCR1, a Y selector circuit YG selects one data line from within each of the four memory blocks MB1-MB4 and couples such selected data lines to corresponding common data lines CD1-CD4. Upon receiving select signals formed by the first redundant Y decoder circuit RYDCR1, a redundant Y selector circuit RYG couples one redundant data line which is arranged, i.e. is disposed, within either of the two redundant blocks RM1 and RM2, to a corresponding redundant common data line RCD1 or RCD2. In such a construction in which two redundant blocks RM1-RM2 are disposed and are correspondingly furnished with the two redundant common data lines RCD1-DDC2, defective data lines which may exist in two of the four memory blocks in the page program mode, can be remedied. This will be discussed in greater detail subsequently.

Data latch circuits FF1-FF6 and write amplifiers WB are provided respectively in correspondence with the common data lines CD1-CD4 and the redundant common data lines RCD1-RCD2. The data input terminals of the data latch circuits FF1-FF6 are connected in common to the output of a data input buffer DIB, and the output signals thereof are respectively coupled to the input terminals of the corresponding write amplifiers WB. The output terminals of the write amplifiers WB are respectively coupled to the common data lines CD1-CD4 and the redundant common data lines RCD1-RCD2. The latch circuits FF1-FF4, corresponding to the respective memory blocks MB1-MB4, are selected by the decoder outputs of the second Y decoder circuit YDCR2, and they hold write data items serially supplied through the data input buffer DIB, in accordance with their respective select signals. Likewise, the latch circuits FF5-FF6, corresponding to the respective redundant blocks RM1-RM2, are selected by the decoder outputs of the second redundant Y decoder circuit RYDCR2, and they hold write data items serially supplied through the data input buffer DIB, in accordance with their respective select signals.

Figure 8:
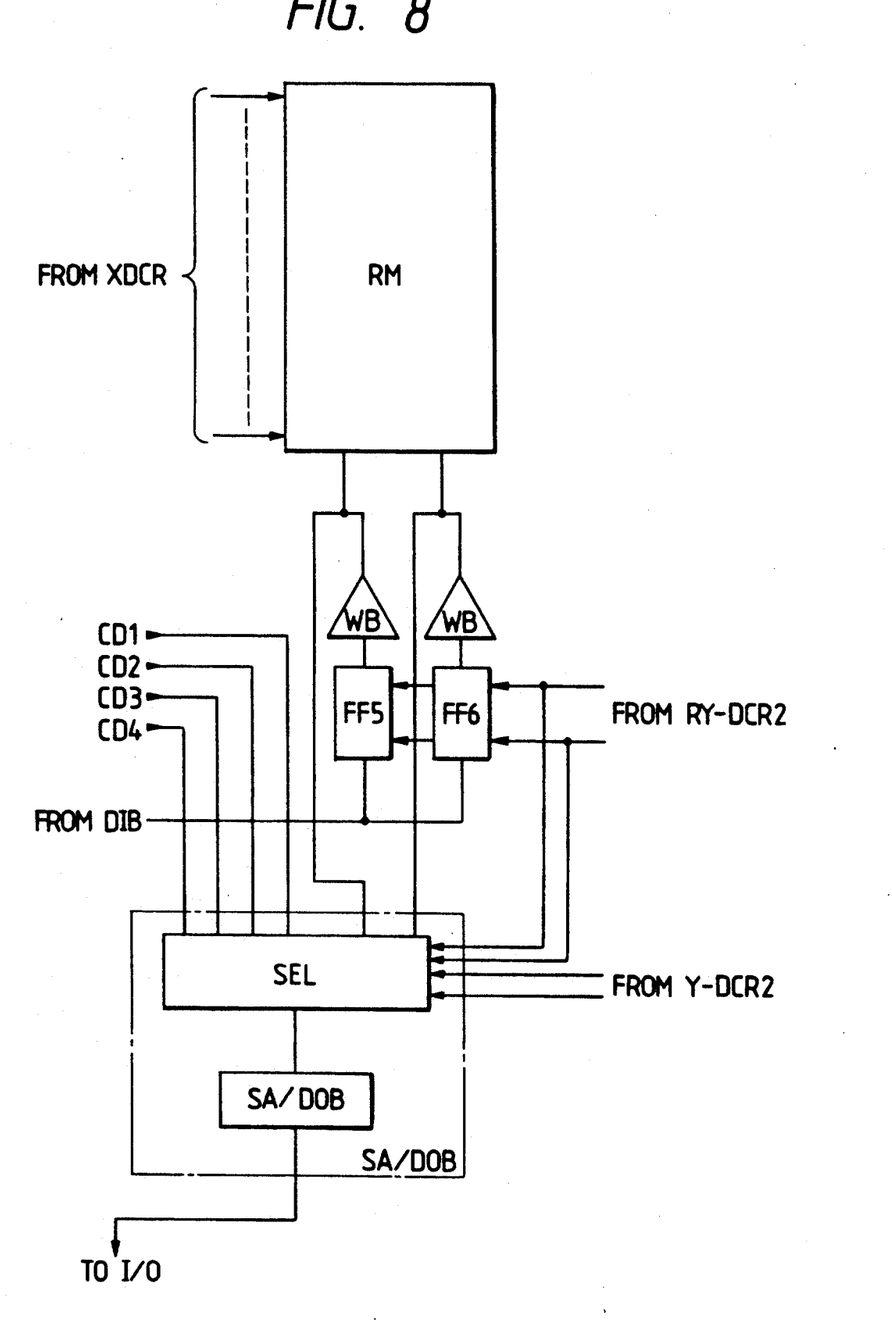
FIG. 8 is a block diagram showing the essential portions of another embodiment of the EPROM to which this invention is applied.
Figure 8A:
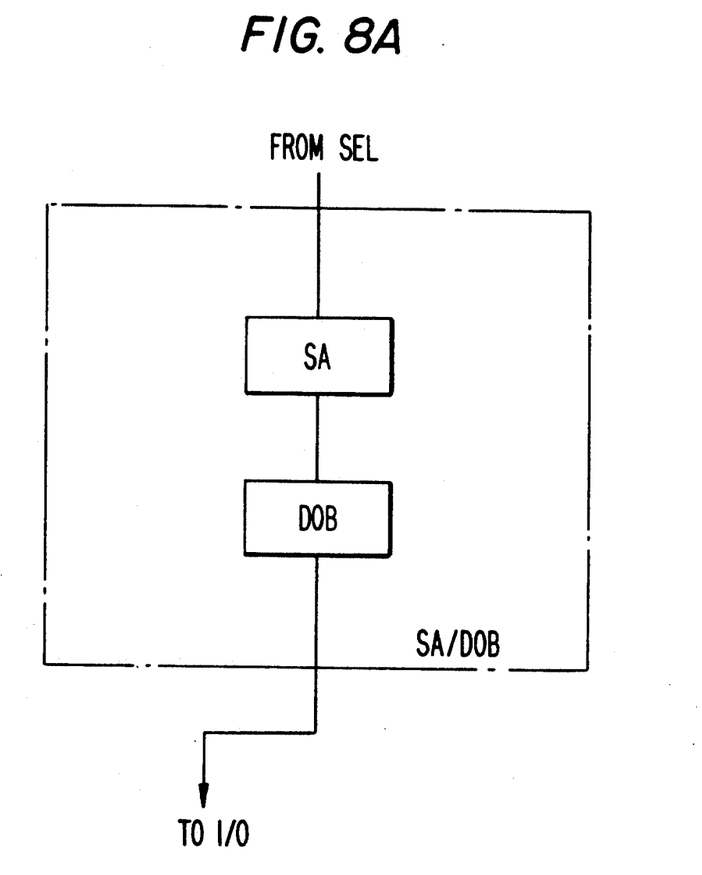
FIG. 8A is a block diagram showing in block diagram form the components which constitute the SA/DOB portion of FIGS. 1 and 8.

The common data lines CD1-CD4 and the redundant common data lines RCD1-RCD2 are selectively connected to a sense amplifier SA of the circuit block SA/-DOB (see FIGS. 8 and 8A). In a read operation, information is read out of the memory array MARY which corresponds to a single-bit information data type unit. As illustrated in FIGS. 8 and 8A, therefore, a selector circuit SEL constructed of transfer gate MOSFETs etc., not shown, is provided at the input side of the sense amplifier SA so that one of the six common data lines CD1-CD4 and RCD1-RCD2, is coupled to the input of the sense amplifier SA in accordance with the outputs of the second Y decoder circuit YDCR2 and the second redundant Y decoder circuit RYDCR2. The output signal of the sense amplifier SA is externally sent from an output terminal I/O through a data output buffer DOB (see FIG. 8A).

Consistent with the above discussion, moreover, the Y decoder circuits YDCR1 and YDCR2 and the redundant Y decoder circuit RYDCR1, with respect to the FIG. 1 configuration, for example, are supplied with the output signals of an address buffer YADB which receives address signals of Y-group AY. By way of example, the second Y decoder circuit YDCR2 is supplied with the address signals of the two lowermost order bits, i.e. the two (2) least significant bits, such as complementary address signals a0 and a1, while the first Y decoder circuit YDCR1 is supplied with the address signals of the higher order bits, i.e., complementary address signals a2–an. The number of address signals is dependent on the number of data lines available in each of the memory blocks MB1–MB4. That is, with respect to a memory array arrangement in which four (4) data lines are included, for example, in each of the memory blocks, such as that disclosed in the above-mentioned U.S. Pat. No. 4,788,665, an in FIG. 1 of the drawings exemplifying the present invention would be represented as a3 since the decoder YDCR1 would require a number of input lines corresponding to a two bit address. However, a different number of data lines may be used so that the Y decoder YDCR1 would require a different number of input address lines from the address buffer YADB. The first redundant Y decoder circuit RYDCR1 is provided with a circuit for storing a defective address, and upon detecting an access to the defective address, it generates a redundant address ry (YRD1, YRD2) to replace the defective address and performs the operation of selecting the redundant Y selector circuit RYG. Moreover, the first redundant Y decoder circuit RYDCR1 sends the redundant address ry to the second redundant Y decoder circuit RYDCR2, which forms a select signal rwy (RDL1, RDL2, $\overline{RDW1}$, $\overline{RDW2}$) for designating one of the two data latch circuits FF5 and FF6. Incidentally, when access to the defective address as stated above is achieved, write data is inhibited from entering the data latch circuits FF1–FF4 in a write operation, and one of the common data lines CD1–CD4 corresponding to the defective address is inhibited from being connected to the input of the sense amplifier SA in the read operation. More specifically, in the write operation, the selection of the data latch circuits FF1–FF4 is inhibited by the second decoder circuit YDCR2, and the data latch circuit FF5 or FF6 is selected instead. In the read operation, the coupling of the common data lines CD1–CD4 to the input of the sense amplifier SA is inhibited by the selector circuit SEL, FIG. 8, and the common data line RCD1 or RCD2 is coupled to the sense amplifier SA by the same. Thus, in the write mode with respect to a defective address, a write signal is transmitted through the latch circuit FF5 or FF6 and the write amplifier WB to the redundant data line selected by the redundant Y selector circuit RYG, while in the read mode, the signal of the redundant common data line RCD1 or RCD2 is transmitted to the input of the sense amplifier SA.

A control circuit CONT receives a writing high voltage $V_{pp}$, a chip enable signal $\overline{CE}$ and an output enable signal $\overline{OE}$ and in response thereto generates various control signals and timing signals required for internal operations.

This embodiment is furnished with the page program mode in which data is written in the form of a 4-byte (or 4-word) unit of information data by the data latch circuits FF1–FF4, etc. as described before. In order to set such a mode, the input circuits, which receive the output enable signal $\overline{OE}$, have the function of detecting when the high voltage $V_{pp}$ reaches a potential which exceeds that of the power source voltage $V_{cc}$, as will be described later. They are utilized for the setting of the page program mode and for data latch operations.

Figure 2:
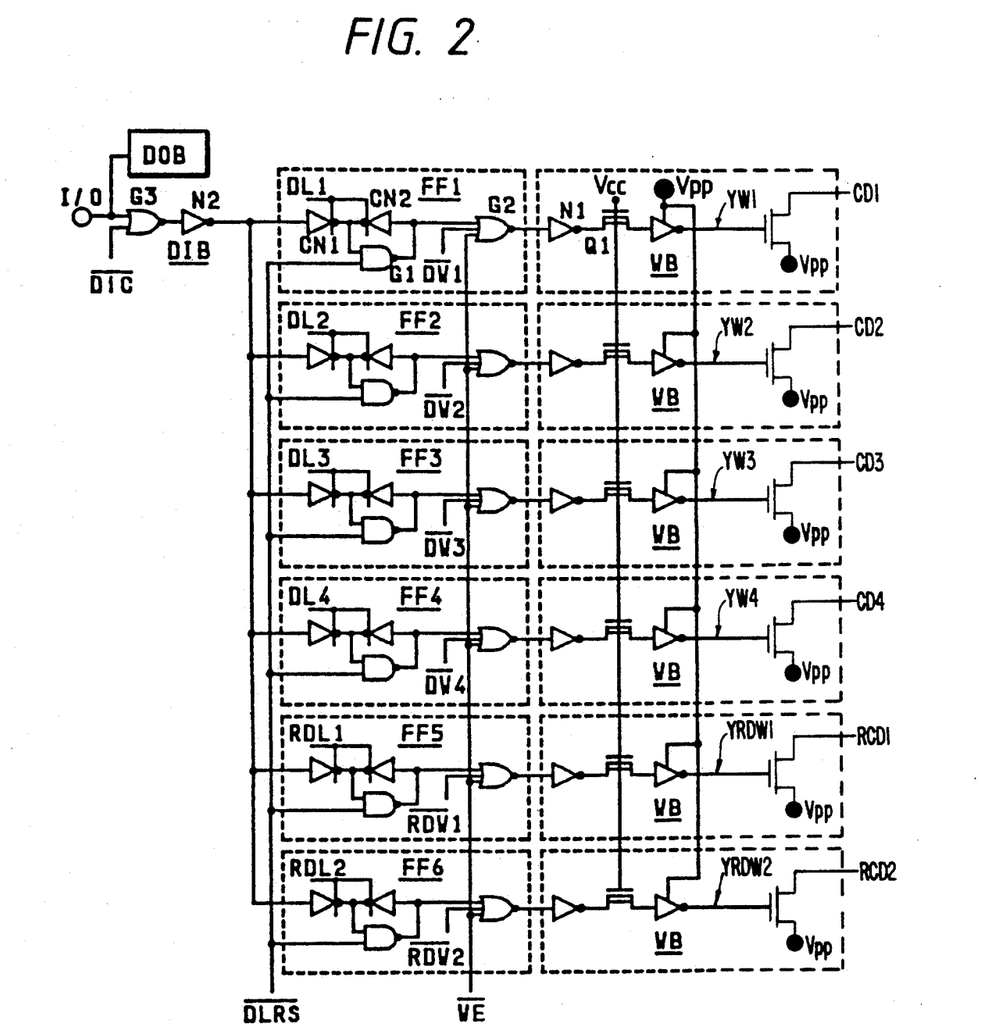
FIG. 2 is a circuit diagram in greater detail showing an embodiment of the data input buffer DIB, data latch circuits FF1–FF6 and the write amplifiers WB associated with a memory array MARY of the EPROM according to FIG. 1.

FIG. 2 shows a circuit diagram of an embodiment of the data input buffer DIB, the data latch circuits FF1–FF6 and the write amplifiers WB.

The external terminal I/O is coupled, on the one hand, to one input of a NOR gate circuit G3 which constitutes the data input buffer DIB. The other input of the NOR gate circuit G3 is supplied with a control signal $\overline{DiC}$. Therefore, when the control signal $\overline{DiC}$ is at a low level (logic "0"), the operation of the data input buffer DIB including the NOR gate circuit G3 is validated, and the output signal of this NOR gate circuit is supplied in common, through an inverter circuit N2, to the input terminals of each of the succeeding latch circuits FF1–FF6. The external terminal I/O is coupled, on the other hand, to the output terminal of the data output buffer DOB.

The data latch circuit FF1 corresponding to the memory block MB1 includes an input clocked inverter circuit CN1, an information holding (feedback) clocked inverter circuit CN2, and a NAND gate circuit G1, the output and one input of which are respectively coupled to the input and output of the clocked inverter circuit CN2, and an output circuit formed of a NOR gate circuit G2 is provided at the output part of the data latch circuit FF1. In the page program mode, the clocked inverter circuits CN1 and CN2 with respect to each data latch circuit are complementarily brought into operating states by a corresponding one of the data latch signals DL1–DL4 which are time-serially generated according to the address signals, as will be described later. More specifically, when the data latch signal DL1 of the data latch FF1, for example, is at a high level (logic "1"), the inputting clocked inverter circuit CN1 is placed in an active operating state, and the feedback clocked inverter circuit CN2 is placed in an inactive or non-operating state providing a high output impedance. Then, when the data latch signal DL1 changes from the high level to a low level (logic "0"), the inputting clocked inverter circuit CN1 is placed in the non-operating state of high output impedance, and the feedback clocked inverter circuit CN2 is placed in the active operating state wherein it operates to hold the accepted data by a regenerative flip-flop action with the correspond NAND gate circuit G1.

The data latch circuits FF2–FF4, corresponding to the other memory blocks MB2–MB4 are respectively constructed similarly to that of data latch circuit FF1. However, the control signals of the respective data latch circuits FF2–FF4 are the data latch signals DL2–DL4. Also, the data latch circuits FF5–FF6 which correspond to the redundant blocks RM1–RM2, respectively, are constructed similarly to that of data latch circuits FF1–FF4, and the control signals thereof are redundant data latch signals RDL1–RDL2, respectively.

A data latch reset signal $\overline{DLRS}$ is supplied to the other input of each one of the NAND gate circuits G1 which constitute the respective latch circuits FF1–FF6. Therefore, when the signal $\overline{DLRS}$ is set at a low level, the latch circuits FF1–FF6 are placed in a reset operating state condition by thus placing the outputs of each one of the NAND gate circuits G1 at a high logic level irrespective of the information data previously held in the latch circuits FF1–FF6.

Data write control signals $\overline{DW1}$–$\overline{DW4}$ and $\overline{RDW1}$–$\overline{RDW2}$ which are formed in a normal program mode, are respectively supplied to the second inputs of the NOR gate circuits G2 which are disposed at the output parts of the latch circuits FF1–FF6.

A write enable signal $\overline{WE}$ is supplied to the third inputs of all the NOR gate circuits G2. Accordingly, the NOR gate circuits G2 which are respectively disposed at the output parts of the latch circuits FF1–FF6 are, in effect, brought into a write mode operating state condition when the write enable signal $\overline{WE}$ is set at a low logic level. During this time, when the write mode is the page program mode, all the signals $\overline{DW1}$–$\overline{RDW2}$ are set at a low logic level. Therefore, the information data items held in the latch circuits FF1–FF4 (and if necessary, the latch circuits FF5–FF6 replacing the defective ones of the latch circuits FF1–FF4) are transmitted to the corresponding data lines (and redundant data lines) through the write amplifiers WB, whereby collective writing (page programming) is performed in the form of a 4-bit unit (collectively in the form of a 4-byte unit with respect to the entire EPROM). On the other hand, when the write mode is the normal program mode, all the signals DL1–RDL2 are set at a high logic level. Therefore, the write data items pass through all the latch parts; however, only that one of the NOR gate circuits G2 which corresponds to the signal $\overline{DWi}$ (or $\overline{RDW1},\overline{RDW2}$) set at the low logic level, in accordance with the addressing information, is enabled to transmit the specific write information data item to the corresponding data line (or redundant data line) through the write amplifier WB associated therewith, whereby normal writing is performed in the form of a 1-bit unit (in the form of a 1-byte unit for the entire EPROM).

Although not to be considered as being limited thereto, each of the write amplifiers WB is constructed as follows: The output signal from the NOR gate circuit G2 of a respective data latch circuit is supplied to an input inverter circuit N1 of a write amplifier associated therewith. The output signal of the input inverter circuit N1 is transmitted through a depletion-mode N-channel MOSFET Q1, whose gate is supplied with a constant power source voltage $V_{cc}$, to the input of a corresponding output amplifier which provides a corresponding one of switch control signals YW1–YW4 and YRDW1–YRDW2. Accordingly write signals of a high level are provided at the common data lines. The output amplifier has a level conversion function whereby a signal amplitude of comparatively low potential level, such as, of the power source voltage $V_{cc}$, is converted into a signal amplitude of high potential level, such as, of the high voltage $V_{pp}$. The switch control signals YW1 etc. are used as the switch control signals of write MOSFETs for transmitting the write signals of the high level to the common data lines and to the redundant common data lines corresponding to these switch control signals. Regarding the specific circuit construction of the write amplifier and, in particular, the output amplifier thereby, a detailed arrangement is disclosed in the above-mentioned U.S. Pat. No. 4,788,665.

By way of example, with respect to the operation thereof, when the output signal from the data latch circuit FF1 is at a high logic level, the output signal of the input inverter circuit N1 becomes a low logic level, and the output signal of a high potential level, such as, of a level corresponding to the high voltage $V_{pp}$ is formed through the output amplifier. Thus, the data line corresponding to the high-level output signal is supplied with the write signal of a high potential level. In contrast, when the output signal from the latch circuit FF1 is at a low level, the output signal of the input inverter circuit N1 becomes a high level, which brings the depletion-mode MOSFET Q1 into an "off" state. Thus, the input of the output amplifier rises up to the high voltage $V_{pp}$, and an output signal of low potential level such as the ground potential $V_{ss}$ of the circuitry is provided as the switch control signal YW1.

Figure 3:
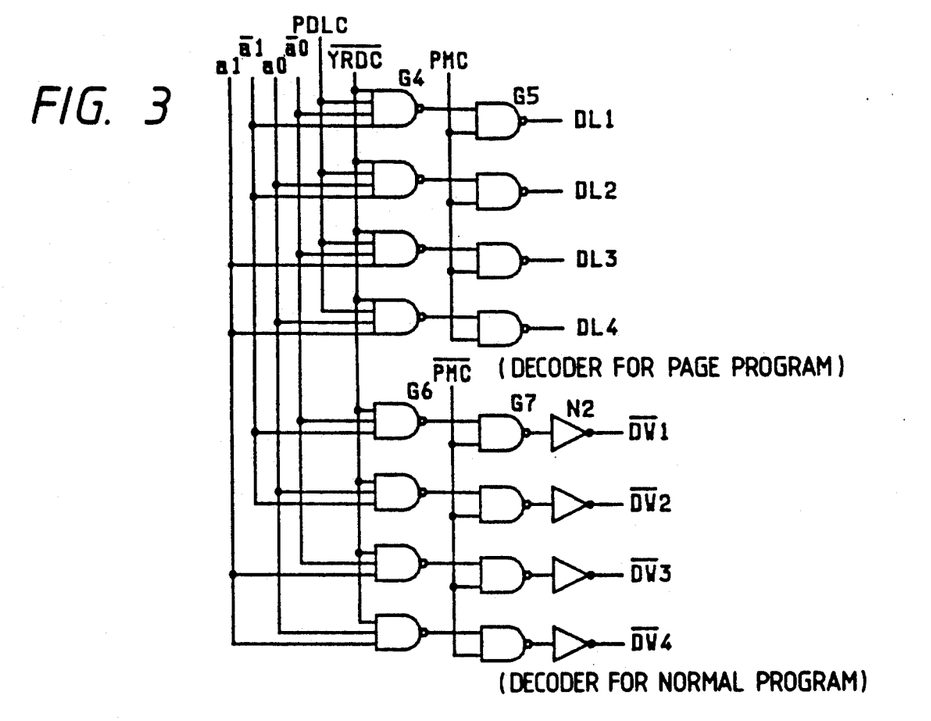
FIG. 3 is a circuit diagram showing an embodiment of the second Y decoder circuit YDCR2 thereof.

FIG. 3 shows a circuit diagram of an embodiment of the second Y decoder circuit YDCR2 which forms the data latch control signals and data write control signals of the data latch circuits FF1–FF4, as stated above.

The decoder circuit YDCR2 of this embodiment has two decode portions, one being for page programming and the other for normal programming. A unit decoder circuit which corresponds to the data latch signal DL1, for example, for the page programming, is constructed as follows: A NAND gate circuit G4 receives address signals $\overline{a0}$ and $\overline{a1}$ among the address signals of the 2 lower order bits (least significant bits) of the group-Y consisting of address signals a0, $\overline{a0}$ and a1, $\overline{a1}$, a page data latch control signal PDLC, and a Y redundant data signal $\overline{YRDC}$; and a NAND gate circuit G5 receives the output signal of the NAND gate circuit G4, and a page program control signal PMC. Each of the other unit circuits corresponding to the other data latch signals DL2–DL4 is similarly constructed, the only difference being in the combination of the address signals which are supplied to the input-side NAND gate circuit G4. For purposes of this description, complementary address signals (ao, $\overline{an}$)~(an, $\overline{an}$ (may be symbolically represented as ao~an, respectively.

Thus, in the page program mode, the output-side NAND gate circuits G5 are enabled by a high level of the signal PMC. Therefore, when the signal PDLC is set at a high level (logic "1") and the signal $\overline{YRDC}$ is set at a high level, the signals DL1–DL4 are formed in accordance with the addressing of the 2 lower order or least significant bits. Accordingly, when the write information data items are sent from the data input buffer DIB in synchronism with the switching of these address signals, they are time-serially (sequentially) entered into the data latch circuits FF1–FF4 in FIG. 2. In the page program mode thus far described, all data write control signals $\overline{DW1}$–$\overline{DW4}$ are negated to a low level by the low level of a signal $\overline{PMC}$, in the decoder for the normal programming to be stated below.

A unit decoder circuit which corresponds to the data write control signal $\overline{DW1}$ for the normal programming, is similarly constructed as follows: a NAND gate circuit G6 receives the address signals $\overline{a0}$ and $\overline{a1}$ of the 2 lower order bits of the group-Y, consisting of the address signals a0 ($\overline{a0}$, a0) and a1 (a1, $\overline{a1}$), and the redundant data signal $\overline{YRDC}$; a NAND gate circuit G7 receives the output signal of the corresponding NAND gate circuit G6 and the inverted page program control signal $\overline{PMC}$ (the phase of which is inverted to that of the page program control signal PMC); and an output inverter circuit N2 associated therewith receives the output signal of the NAND gate circuit G7. Each of unit decoder circuits corresponding to the other data write control signals $\overline{DW2}$–$\overline{DW4}$ is similarly constructed, the only difference being in the combination of the address signals which are supplied to the input-side NAND gate circuit G6.

Thus, in the normal program mode, the output-side NAND gate circuits G7 are enabled by the high level of the inverted signal $\overline{PMC}$. Therefore, when the signal $\overline{YRDC}$ is at the high level since the corresponding address is non-defective, the signals $\overline{DW1}$–$\overline{DW4}$ are selectively formed in accordance with the addressing of the above-said 2 lower order bits. Accordingly, when the write information data item is sent from the data input buffer DIB in correspondence with the addressing, it is passed through the corresponding one of the data latch circuits FF1-FF4 in FIG. 2 and is selected by the NOR gate circuit G2 of the output part thereof so as to be transmitted to the write amplifier WB. On this occasion, in the decoder for the page programming, all the signals DL1-DL4 are set at a high level by the low level of the signal PMC, and the data latch circuits FF1-FF4 are held in the "through" states (signal transfer operating condition), as stated above.

In addition, when a defective address has been detected, the signal $\overline{\text{YRDC}}$ becomes a low level, to negate or invert the signals DL1-DL4 to a low level in the page program mode and to negate the signals $\overline{\text{DW1}}$-$\overline{\text{DW4}}$ to a high level in the normal program mode. Thus, the outputs of the redundant decoder circuit to be described below are, in effect, validated, and the redundant data lines are selected.

Figure 4:
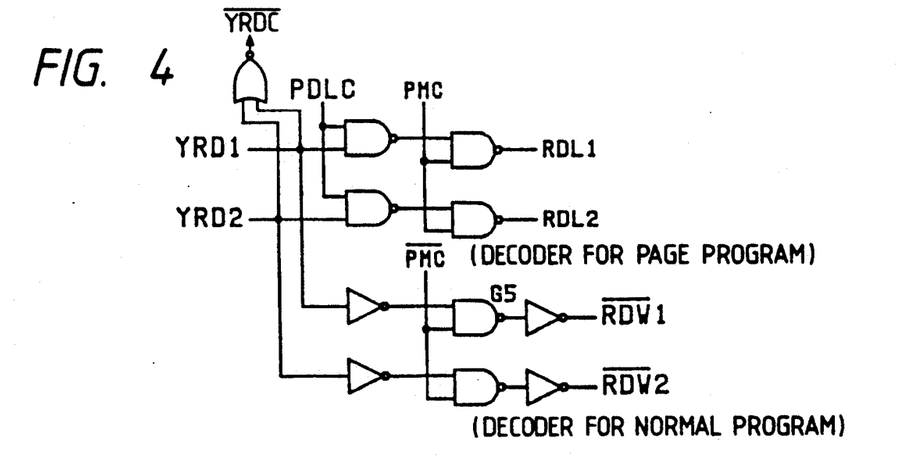
FIG. 4 is a circuit diagram showing an embodiment of the second redundant Y decoder circuit RYDCR2 thereof.

FIG. 4 shows a circuit diagram of an embodiment of the second redundant Y decoder circuit RYDCR2 which forms the select signals of the redundant data latch circuits FF5-FF6 as stated above.

As in the foregoing, the decoder circuit RYDCR2 of this embodiment has two decode portions, one being for the page programming and the other for the normal programming. A unit decoder circuit which corresponds to the redundant data latch signal RDL1 for the page programming, is constructed as follows: A NAND gate circuit receives a defective address detection signal YRD1 provided by one of the defective address detector circuits, and the page data latch control signal PDLC. Another NAND gate circuit which is in cascade connection (or series connection) therewith receives on one of its two inputs the output signal of the first-mentioned NAND gate circuit, and on the other input the page program control signal PMC. A unit circuit corresponding to the other redundant data latch signal RDL2 is similarly constructed except that a defective address detection signal YRD2 which is supplied to the input-side NAND gate circuit is provided by another defective address detector circuit. Thus, in the page program mode, the output-side NAND gate circuits are enabled by the high level of the signal PMC. Therefore, when the signal PDLC is at the high logic level and the signal YRD1 is set at a high logic level which is in correspondence with accessing the defective address, the signal RDL1, of a high logic level, is formed. Accordingly, the data latch circuit FF5 is selected to accept input data in synchronism with this addressing in place of one of the data latch circuits FF1-FF4 associated with a defective address. In this way, information data items are collectively (concurrently) transmitted to the data lines of the memory blocks corresponding to the other ones of the data latch circuits FF1-FF4, which are associated with a nondefective address, and to the data line of the redundant block RM1 corresponding to the data latch circuit FF5.

A unit decoder circuit which corresponds to the redundant data write control signal $\overline{\text{RDW1}}$ for the normal programming, is constructed as follows: An inverter circuit receives the defective address detection signal YRD1 similarly as above; a NAND gate circuit associated therewith receives at one of its two inputs the output signal of the inverter circuit and at the other input thereof the inverted page program control signal $\overline{\text{PMC}}$; and an output inverter circuit receives the output signal of the NAND gate circuit. The other unit decoder circuit is similarly constructed; however, the input-side inverter circuit thereof is supplied with the other defective address detection signal YRD2.

Thus, in the normal program mode, the NAND gate circuits are enabled by the high level of the inverted signal $\overline{\text{PMC}}$. Therefore, when the signal YRD1 is set at the high level in correspondence with an access to the defective address, the signal $\overline{\text{RDW1}}$ is provided. Accordingly, a write information data item supplied from the data input buffer DIB is passed (transmitted) through the data latch circuit FF5 and is transmitted to the write amplifier WB associated therewith via the NOR gate circuit G2 of the output part of this data latch circuit in response to a low logic level of the corresponding redundant data write control signal $\overline{\text{RDW1}}$ associated therewith.

Moreover, the defective address detection signals YRD1 and YRD2 are supplied to a NOR gate circuit. Thus, the Y redundant data signal $\overline{\text{YRDC}}$ which becomes a low level upon the detection of the defective address is output from the NOR gate circuit of FIG. 4.

Figure 5:
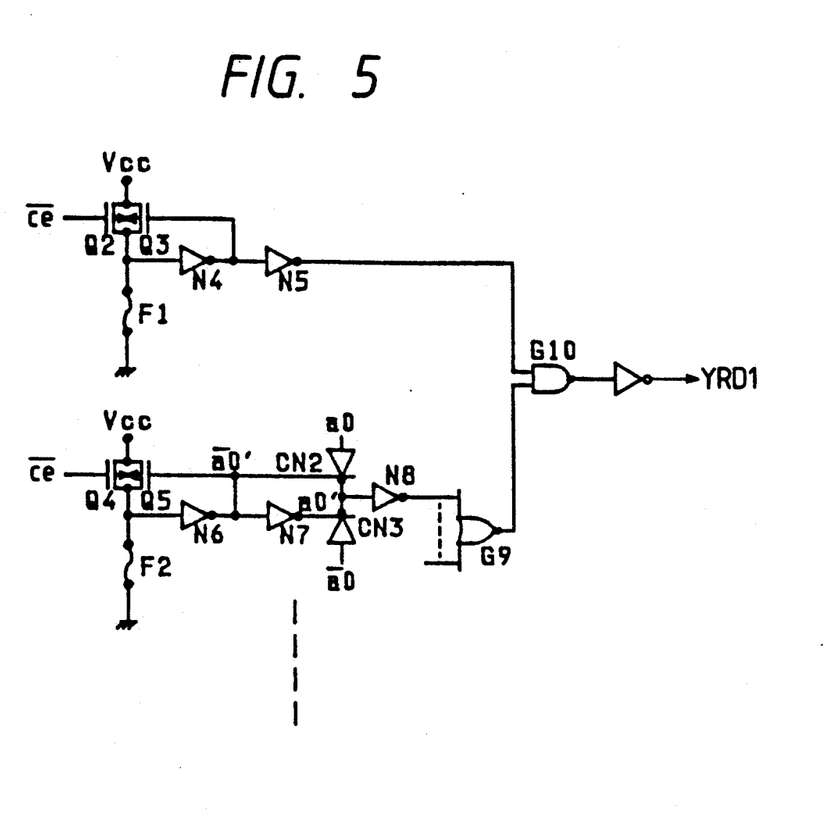
FIG. 5 is a circuit diagram showing an embodiment of the first redundant address decoder circuit RYDCR1 thereof.

FIG. 5 shows a circuit diagram of an embodiment of the first redundant address decoder circuit RYDCR1.

This decoder circuit has the functions of storing and detecting defective addresses. Although it should not be considered as being restricted thereto, the operation of designating the defective addresses is performed in such a way that fuse means F1, F2, ... formed of polycrystalline silicon layers or the like are cut by irradiation with a laser beam and have their resistances changed by laser annealing.

In the illustrated part of the decoder circuit concerning the fuse means F1, current is supplied from the terminal supplied with the power source voltage $V_{cc}$ to the fuse means F1 through P-channel MOSFETs Q2 and Q3, the channels of which are connected in parallel. The gate of the MOSFET Q2 is supplied with an internal chip enable signal $\overline{\text{ce}}$ which is formed on the basis of the chip enable signal $\overline{\text{CE}}$. In addition, the gate of the MOSFET Q3 is supplied with the output signal of a logic inverter circuit N4 which forms the signal in accordance with the presence or absence of an opencircuit which may be effected by the cutting of the fuse means F1, whereby a feedback loop is constructed. Thus, stable stored information conforming to the presence or absence of the cutting of the fuse means F1 can be obtained.

By way of example, the fuse means F1 is utilized for setting the defective address. In order to indicate whether the detected defective address is "valid" or "invalid," the information associated with the setting of a defective address must be combined with a defective-address storing signal which will be explained later. The reason therefor is a follows: Even when no defective address is designated by way of example, a defective-address storing portion becomes equivalent to storing an address whose bits are all logic "1" or logic "0." Accordingly, there arises the drawback that, when such an address is being accessed wherein the address bits thereof are all at logic "1" or logic "0," the replacement with the redundant circuit is done in spite of the absence of a defect.

Similarly to the above, the address storing portion includes the fuse means F2, a logic inverter circuit N6, and P-channel MOSFETs Q4 and Q5. The output signal of the inverter circuit N6 is an inverted defective-address signal a0', which is supplied to the clock terminal of a clocked logic inverter circuit CN2 constituting an address comparator circuit. On the other hand, a noninverted defective-address signal a0' formed by passing the inverted signal $\bar{a}0'$ through a logic inverter circuit N7 is supplied to the clock terminal of a clocked logic inverter circuit CN3 constituting the address comparator circuit. The input of the clocked inverter circuit CN2 is supplied with the noninverted internal address signal a0 which is in phase with an address signal A0 that is externally supplied in a memory access. Further, the input of the clocked inverter circuit CN3 is supplied with the inverted internal address signal $\bar{a}0$, the phase of which is opposite to that of the address signal A0 (Y-group address signal).

By way of example, in a case where the fuse means F2 has been cut (open-circuit), the inverted defective-address signal $\bar{a}0'$ is set at a low logic level, and the noninverted defective-address signal a0' is set at a high logic level. Accordingly, the operation of the clocked inverter circuit CN3 is validated. Thus, when the corresponding noninverted internal address signal a0 is set at a high logic level by the memory access, a low level signal of agreement is delivered from the output of the clocked inverter circuit CN3, and when the internal address signal a0 is at a low logic level, a high logic level signal of disagreement is delivered. On the other hand, in a case where the fuse means F2 is not cut, the inverted defective-address signal $\bar{a}0'$ is set at a high logic level, and the noninverted defective-address signal a0' is set at a low logic level. Accordingly, the operation of the clocked inverter circuit CN2 is validated. Thus, when the corresponding inverted internal address signal $\bar{a}0$ is set at a high logic level by the memory access, a low level signal of agreement is delivered from the output of the clocked inverter circuit CN2, and when the signal $\bar{a}0$ is at a low level, a high level signal of disagreement is delivered.

A NOR logic gate circuit G9 forms a defective-address detection signal of a high logic level when, as to the Y-group address signals, the address comparison outputs of all the bits are at the logic "0" level. The detection signal of the NOR gate circuit G9 is delivered as an output through a NAND logic gate circuit G10, under the condition that the defective-address setting signal is the logic "1" level. The output signal of the NAND gate circuit G10 has its phase inverted by a logic inverter circuit, and the resulting signal is output as the defective-address detection signal YRD1.

Although it should not be considered as being specifically restricted thereto, the first redundant address decoder circuit RYDCR1 generates the defective-address detection signal YRD2 with a circuit arrangement which is constructed similarly to the above circuit arrangement. However, a defective address which is different from that just described with respect to the circuit arrangement shown in FIG. 5 can similarly be written into the fuse means F1 and F2 of a similar type of circuit arrangement (although not shown). In this case, although it is not to be considered as being limited thereto, the defective-address detection signal YRD1 is output from the circuit arrangement shown in FIG. 5, and the defective-address detection signal YRD2 is likewise output from a similarly corresponding circuit (although not shown).

Figure 6:
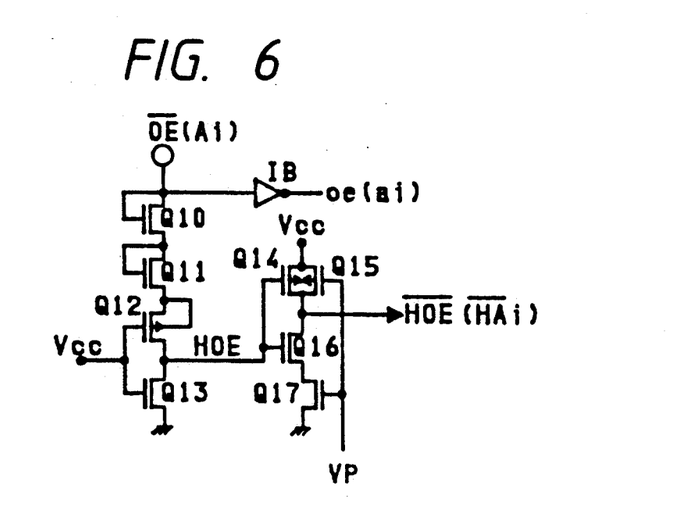
FIG. 6 is a circuit diagram showing an embodiment of a high voltage detector circuit.

FIG. 6 shows a circuit arrangement of an embodiment of the high voltage detector circuit which is used for setting the page program mode.

The external terminal $\overline{OE}$ is coupled, on the one hand, to the input terminal of an input buffer IB, through which an internal signal oe is formed.

The terminal $\overline{OE}$ is coupled, on the other hand, to the input terminal of the following high voltage detector circuit in order to permit threat inputs of three different voltage values. A voltage signal supplied from the terminal $\overline{OE}$ has its level shifted through, for example, N-channel MOSFETs Q10 and Q11, each of which is connected in a diode form (a common gate-to-drain connection), and the resulting signal is used as the operating voltage of a CMOS logic inverter circuit which is configured of a P-channel MOSFET Q12 and an N-channel MOSFET Q13. Although it is not to be considered as being limited thereto, the gates of the MOSFETs Q12 and Q13 constituting the CMOS inverter circuit are supplied with the power source voltage $V_{cc}$. The conductance of the N-channel MOSFET Q13 is set to be a comparatively low value. Therefore, when the terminal $\overline{OE}$ is at a relatively low potential level such as the power source voltage $V_{cc}$ or ground (0v), the P-channel MOSFET Q12 is brought into an "off" state, by way of example, and an output signal HOE is responsively set at a low level such as the ground potential of the circuitry. Alternatively, in the state in which the terminal $\overline{OE}$ is supplied with a predetermined high voltage exceeding the power source voltage $V_{cc}$ by at least the potential of the level shift across MOSFETs Q10 and Q11 plus the voltage threshold of MOSFET Q12, the P-channel MOSFET Q12 is brought into an "on" state along with the MOSFETs Q10 and Q11. Then, the output signal HOE is set at a high potential level in accordance with the voltage ratio determined by the combined conductance of the MOSFETs Q10, Q11 and Q12 and the conductance of the N-channel MOSFET Q13 which is brought into an "on" state by the forward biasing effected by the power source voltage $V_{cc}$ supplied to the gate thereof. This signal HOE is supplied to those gates of MOSFETs Q14 and Q16 which serve as one input of a NAND gate circuit configured of P-channel MOSFETs Q14, Q15 and N-channel MOSFETs Q16, Q17. The gates of the MOSFETs Q15 and Q17, which serve as the other input of the NAND gate circuit, are supplied with a control signal VP which indicates that the writing high voltage $V_{pp}$ is fed to the external terminal $V_{pp}$. Thus, the output signal HOE of the high voltage detector circuit corresponding to the terminal $\overline{OE}$ is validated in the write state in which the high voltage $V_{pp}$ is fed. By way of example, the control signal VP which is also an enabling signal of the NAND gate circuit can be formed by furnishing the external terminal with a detector circuit (MOSFETs Q10–Q13) as described above.

Such a high voltage detector circuit may well be provided in connection with detection of a specified address terminal Ai as indicated by parentheses in the figure, in addition to the detection of the aforementioned control signal terminal $\overline{OE}$, whereby inputs of three values are applied as address signals and are utilized for setting various modes.

Figure 7:
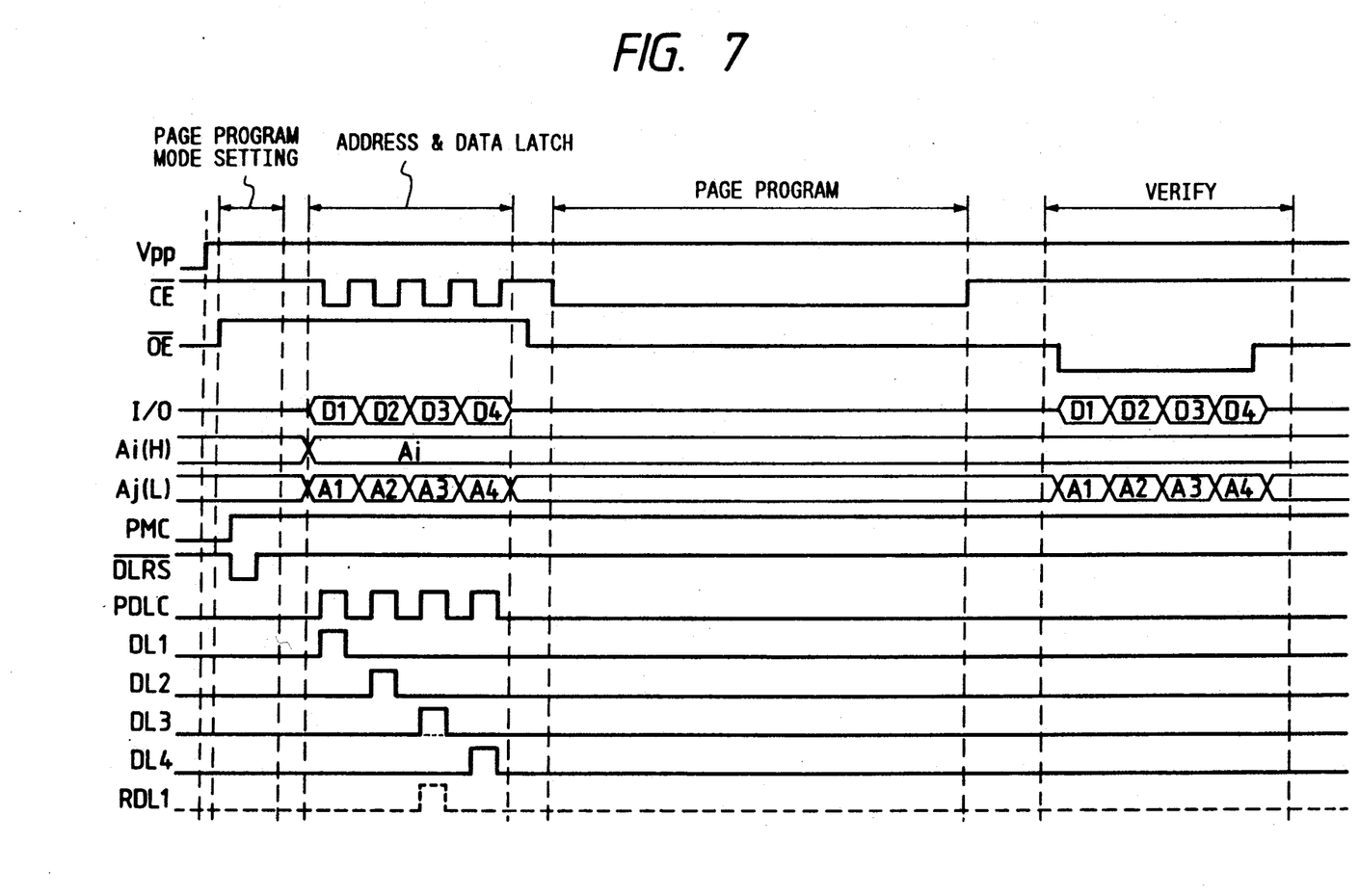
FIG. 7 is a timing chart for explaining an example of a page program mode in the EPROM.

An example of the page program mode in the EPROM of this embodiment will be briefly explained with reference to a timing chart of FIG. 7.

The control circuit CONT recognizes the page program mode of operation on the basis of having determined that a high voltage, such as of about 12 V, has been applied to the external terminal $V_{pp}$, that the external chip enable signal $\overline{CE}$ has been set at the high level, and that the external output enable signal $\overline{OE}$ has been set at the high voltage. Then, the control circuit CONT asserts this by setting the page program mode signal PMC at the high logic level, and it generates the data latch reset signal $\overline{DLRS}$ to thereby reset the data latch circuits FF1-FF6.

In such a page program mode, using the low level of the chip enable signal $\overline{CE}$ as a clock, the address signals are supplied from the address terminals in synchronism with the above $\overline{CE}$ low level, and the write information data items D1-D4 are serially supplied from the input-/output terminal I/O. During this time, however, the address signals Ai(H) of the higher order bits are held as fixed address signals. Regarding the address Aj(L) of the lower order bits, in connection with the construction in which the four data latch circuits are disposed in correspondence with the four memory blocks as previously described, the signals of the 2 lowermost order bits (two least significant bits) are changed in synchronism with the signal $\overline{CE}$ as the corresponding address signals for designating the data latch circuits. The pulses of the page data latch signal PDLC are formed in response to the changes of the signal $\overline{CE}$ to the low level by the control circuit CONT, and the data latch signals DL1-DI4 are generated in time series in accordance with the addresses A1-A4 designated by the address signals Aj. The data latch circuits FF1-FF4 accept the information data items in synchronism with the data latch signals DL1-DL4, respectively. When a defective address (for example, the address A3) is accessed in such a write data latch operation, the data latch circuit (FF3) corresponding thereto is replaced with the redundant data latch circuit (FF5 or FF6), into which the information data item is accepted. In this case, as indicated by broken lines, the control signal DL3 for the data latch circuit FF3 is not formed, but the control signal RDL1 for the redundant data latch circuit FF5 is formed instead.

In this embodiment, when the data latch operation thus far described has ended, the chip enable signal $\overline{CE}$ is set at the low level with the output enable signal $\overline{OE}$ being held at the high level, in this case, to thereby instruct the write operation, although it should not be considered as being necessarily limited thereto. Thus, in each memory array MARY, the data items are simultaneously written in the form of a 4-bit unit of information data.

In a case where the write operation is followed by the verify operation, the chip enable signal $\overline{CE}$ is set at the high level, and the output enable signal $\overline{OE}$ is changed from the high level to the low level. Simultaneously, the address signals Aj of the 2 lower order bits are supplied so as to designate the addresses A1-A4. Therefore, the written information data items D1-D4 of 4 bits are thus read out.

A writing device (for example, EPROM writer), not shown, decides (determines) as to whether there is agreement/disagreement between the written data and the read data. The EPROM writer executes the writing operation for the EPROM to write desired data, such as, "d" into a predetermined address, for example, "X" in the EPROM, and the writer executes the verify operation for the EPROM thereafter. In the verify operation, the EPROM writer reads out the data from the predetermined address "X" of the EPROM and compares the read out data with the desirable data "d" to be written in the address "X." If the read out data coincides with the desirable or expected data, i.e., a logic coincidence is effected, the EPROM writer executes an over-writing operation for the EPROM in order to allow the memory cells having the predetermined address "X" to securely hold the desirable data stored "d" therein. In the over-writing operation, the EPROM writer supplies to those memory cells corresponding to the predetermined address "X" a writing voltage indication of data to be written thereat. The EPROM writer ends the writing operation for the memory cells of the predetermined address "X" following the over-writing operation and executes the writing operation of different memory cells corresponding to a different address from that of predetermined address "X." That is, the case of an agreement, in upon verifying that the desired data has been written into the memory cell, the writing device performs the last-stage writing (overwriting operation), for example, and ends the writing into the address.

In contrast, when the written data and the read data disagree, the writing device writes the data repeatedly until the proper writing is verified. As for example, if the read out data does not coincide, i.e. it is not logically coincident, with the desirable data "d," for example, the EPROM writer repeatedly executes the writing operation for the memory cells having the predetermined address "X" for a number of times. However, the number of such repeatedly executed writing operations is limited to a predetermined number, e.g. 25. If after executing the writing operations repeatedly for such a predetermined number of times, the read out data has not yet coincided with the desirable data, the EPROM is regarded as being a defective device.

Incidentally, in reading out the written data, the output enable signal $\overline{CE}$, although not particularly limited thereto, may be clocked. Under such a clocking arrangement, a floating state appear between the information data items which are output.

The following results and advantages realized therefrom are achieved in accordance with the improvements realized from the present invention as exemplified by the embodiments described above:

(1) Redundant data lines are provided in such a way that at least one redundant data line is associated with a corresponding one of the plurality of memory blocks constituting a memory. In each of the memory blocks, nonvolatile memory elements are arranged as a matrix array of rows and columns of nonvolatile memory elements. Data lines corresponding to the respective memory blocks are selectively coupled to corresponding ones of first common data lines by a Y selector circuit in accordance with outputs of a first Y decoder, while a redundant data line is selectively coupled to a redundant common data line by a redundant selector circuit in accordance with an output of a redundant decoder. Moreover, a plurality of latch circuits are provided for temporarily storing (or latching) and transmitting write information data items, received from a data input buffer, in accordance with outputs of a second Y decoder and a second redundant decoder. Each one of the plurality of latch circuits, furthermore, is coupled on its output side to a respective one of a plurality of write amplifiers which, in turn, transmit write signals to the common data lines and the redundant common data line respectively corresponding thereto in accordance with stored information data items of respective latch circuits associated therewith. In the case where only a small number of redundant data lines are laid-out, an output of a redundant data latch circuit is directly coupled to a redundant data line in accordance with an output of a redundant decoder corresponding to the second redundant decoder, described above. In accordance with such a construction, among the plurality of data lines being addressed in the plurality of memory blocks, only a defective data line which corresponds to a defective address is replaced with a respective redundant data line, so that the number of the redundant data lines can be set at the required minimum. Accordingly, as a result of such a construction, a high density of integration can be realized while a page program function is held.

(2) In order to set the page program mode, described above, a specified external terminal such as for an output enable signal $\overline{OE}$ has the function of inputting three values containing a high voltage, without providing any special external terminal, so that the configuration as to the number of external terminals required can be made the same as in an existing EPROM device. Thus a device having the construction as described above can be implemented without having to increase the number of external terminals required, and that insofar as a writing device (EPROM writer) for use is concerned, an existing one can be used without any change for a normal program, while it may be partly modified for a page program.

Although, in the above, the invention made by the inventors has been specifically described in conjunction with the exemplifying embodiments illustrated in the accompanying drawing figures, it is needless to say that this invention is not to be considered as being limited to the foregoing embodiments, but that it can be exemplified in accordance with alternative embodiments thereof including obvious modifications and variations of those aforedescribed which are within the spirit and scope thereof. By way of example, regarding the number of the divided memory blocks employed, it depends on various aspects pertaining to the performance requirements of the device adopted. In addition, regarding the number of the redundant data lines employed and which are laid-out (arranged) in each memory array, it depends on various aspects pertaining to the performance requirements adopted. Further, redundant circuits may also be provided for the word lines in addition to the construction, as described above, in which redundant data lines are laid-out for the data lines. Thus, even in the case where the word lines have become broken, the defects associated therewith can be remedied. Herein, since the word lines are shared by all the memory arrays as previously described, redundant word lines can be laid-out without having to consider the page program mode described above. Regarding the setting of the page program mode, apart from the aforementioned expedient technique which is based on the combination between the high voltage supplied from the specified control terminal and the other control signals, it is possible to adopt various aspects of performance, e.g., one utilizing the high voltage of an address terminal. Moreover, the invention can adopt such various aspects of performance in that the method of storing defective addresses consists of electrically melting the fuse means, and that the comparator circuit for the defective address employs, furthermore, a transfer gate MOSFET.

Moreover, in a case where the number of the redundant data lines is comparatively small, the redundant Y selector circuit RYG shown in FIG. 1 can be dispensed with. As illustrated in the alternative embodiment in FIG. 8, by way of example, in a case where a redundant memory block RM has two redundant data lines, the outputs of the corresponding write amplifiers associated therewith can be instead directly coupled to the redundant data lines and that the redundant data lines are coupled to a selector circuit SEL. With this type of arrangement, in the write operation, the redundant data lines are, in effect, selected by the second redundant decoder RY-DCR2, and in the read operation, they are, in effect, selected by the selector circuit SEL. According to this embodiment, since the redundant Y selector circuit RYG can be dispensed with, the corresponding chip area can be reduced. In FIG. 8, portions having the same functions as in the embodiment of FIG. 1 are assigned the same symbols and shall not be described in detail.

This invention is also similarly applicable to various EEPROMs which are, furthermore, of the electrically erasable type, in addition to EPROMs of the electrically programmable type. Each of these semiconductor memory devices may well be built in a semiconductor integrated circuit device such as a single-chip microcomputer.

What is claimed is:

1. A semiconductor memory device having a plurality of input terminals each of which receives a plurality of bits of data in series in a predetermined operation mode, comprising:

a plurality of memory blocks, each memory block including a plurality of nonvolatile memory elements respectively coupled to corresponding word and data lines, each memory element having a threshold voltage which changes in accordance with write information associated therewith;

at least one redundant memory block having at least one redundant data line, at least one word line and at least one nonvolatile memory element coupled to said at least one redundant data line and to said at least one word line, wherein said at least one redundant data line is selectively employed in place of a defective data line in one of said plurality of memory blocks;

first data line selecting means for selectively coupling data lines of said plurality of memory blocks to corresponding first common data lines in accordance with a first signal provided by a column decoder;

redundant data line selecting means for selectively coupling said at least one redundant data line to a redundant common data line in accordance with a second signal provided by a redundant decoder;

a plurality of latch circuits including a plurality of first latch circuits having respective inputs commonly coupled to one input terminal of said input terminals and at least one second latch circuit having an input which is coupled to said one input terminal, wherein said first latch circuits latch predetermined bits of said plurality of bits of data in sequence in accordance with a third signal provided by said column decoder if data lines to be selected by said first data line selecting means do not include a defective data line and wherein said at least one second latch circuit latches one bit of data of said plurality of bits of data in accordance with a fourth signal provided by said redundant decoder instead of one of said first latch circuits if the data lines to be selected by said first data line selecting means include at least one defective data line; and a plurality of write amplifiers having inputs respectively coupled to outputs of corresponding ones of said first and second latch circuits and having outputs respectively coupled to said first common data lines and said redundant common data line, said write amplifiers respectively transmitting write signals to corresponding selected data lines and to said at least one redundant data line, and said write signals corresponding to stored data held by corresponding latch circuits coupled therewith.

2. A semiconductor memory device according to claim 1, wherein said nonvolatile memory elements constitute erasable and programmable read-only memory (EPROM) elements.

3. A semiconductor memory device according to claim 2, wherein each block includes an arrangement of rows and columns of nonvolatile memory elements, each row and column of nonvolatile memory elements corresponding to a word and data line, respectively, and wherein each word line corresponds to a row of nonvolatile memory elements in each one of said plurality of blocks.

4. A semiconductor memory device according to claim 3, wherein said plurality of memory blocks include at least one memory array, coupled to a single external input/output terminal for serially receiving and outputting bits of data.

5. A semiconductor memory device according to claim 4, wherein said plurality of memory blocks comprise a plurality of memory arrays, each memory array corresponding to a group of memory blocks from said plurality of memory blocks, and wherein in each memory array there is included at least one redundant memory block, each redundant memory block having at least one redundant data line.

6. A semiconductor memory device according to claim 5, wherein each of said plurality of memory arrays respectively corresponds to a separate external input/output terminal where respective bits of data are serially inputted and outputted and which serially inputted bits of data are simultaneously applied to corresponding first common data lines of individual memory blocks in respective memory arrays, via corresponding latch circuits and write amplifiers, during a page program mode, corresponding to said predetermined operation mode, and which are serially applied to corresponding data lines selected during a normal program mode.

7. A semiconductor memory device according to claim 6, wherein said page program mode is set by an output signal of a high voltage detector circuit, said high voltage detector circuit generating said output signal in response to a high input signal, applied to an external terminal of said semiconductor memory device, of a level exceeding a power source voltage associated with said device.

8. A semiconductor memory device according to claim 7, wherein the external terminal of said semiconductor device corresponds to one associated with an output enable signal ($\overline{OE}$) of the semiconductor device.

9. A semiconductor memory device according to claim 8, wherein said page program mode is effected in response to the detection of said high input signal if a high writing voltage is being applied at a corresponding external terminal associated therewith and an external chip enable signal ($\overline{CE}$) is at a high logic level at another external terminal.

10. A semiconductor memory device according to claim 1, wherein said plurality of memory blocks comprise at least one memory array, each memory array being coupled to a single external input/output terminal for serially receiving and outputting bits of data.

11. A semiconductor memory device according to claim 10, wherein said plurality of memory blocks comprise a plurality of memory arrays, each memory array corresponding to a group of memory blocks from said plurality of memory blocks, and wherein in each memory array there is included a least one redundant memory block, each redundant memory block having at least one redundant data line.

12. A semiconductor memory device according to claim 11, wherein each of said plurality of memory arrays respectively corresponds to a separate external input/output terminal where respective bits of data are serially inputted and outputted and which serially inputted bits of data are simultaneously applied to corresponding first common data lines of individual memory blocks in respective memory arrays, via corresponding latch circuits and write amplifiers, during a page program mode, corresponding to said predetermined operation mode, and which are serially applied to corresponding data lines selected during a normal program mode.

13. A semiconductor memory device according to claim 12, wherein said page program mode is set by an output signal of a high voltage detector circuit, said high voltage detector circuit generating said output signal in response to a high input signal, applied to an external terminal of said semiconductor memory device, of a level exceeding a power source voltage associated with said device.

14. A semiconductor memory device according to claim 13, wherein the external terminal of said semiconductor device corresponds to one associated with an output enable signal ($\overline{OE}$) of the semiconductor device.

15. A semiconductor memory device according to claim 14, wherein said page program mode is effected in response to the detection of said high input signal if a high writing voltage is being applied at a corresponding external terminal associated therewith and an external chip enable signal ($\overline{CE}$) is at a high logic level at another external terminal.

16. A semiconductor memory device according to claim 1, wherein said predetermined operation mode includes a page program mode of simultaneously writing data as bits of data, serially applied at one or more external terminals respectively associated with individual groups of memory blocks comprised from said plurality of memory blocks and said at least one redundant memory block, to corresponding first common data lines of individual memory blocks in each respective group thereof and is set by an output signal of a high voltage detector circuit, said high voltage detector circuit generating said output signal in response to a high input signal, applied to an external terminal of said semiconductor memory device, of a level exceeding a power source voltage associated with said device.

17. A semiconductor memory device according to claim 16, wherein said nonvolatile memory elements constitute erasable and programmable read-only memory (EPROM) elements.

18. A semiconductor memory device according to claim 16, wherein the external terminal of said semiconductor device corresponds to one associated with an output enable signal ($\overline{OE}$) of the semiconductor device.

19. A semiconductor memory device according to claim 18, wherein said page program mode is effected in response to the detection of said high input signal if a high writing voltage is being applied at a corresponding external terminal associated therewith and an external chip enable signal ($\overline{CE}$) is at a high logic level at another external terminal.

20. A semiconductor memory device according to claim 19, wherein said nonvolatile memory elements constitute erasable and programmable read-only memory (EPROM) elements.

21. A semiconductor memory device having a plurality of input terminals each of which receives a plurality of bits of data in series in a predetermined operation mode and the received plurality of bits of data are simultaneously written in the semiconductor memory device in the predetermined operation mode, said semiconductor memory device comprising:
a plurality of memory blocks, each memory block including a plurality of nonvolatile memory elements respectively coupled to corresponding word and data lines, each memory element having a threshold voltage which changes in accordance with write information associated therewith;
at least one redundant memory block including a plurality of word lines, a plurality of redundant data lines, and a plurality of nonvolatile memory elements respectively coupled to corresponding ones of said plurality of word lines and said plurality of redundant data lines, wherein each of said redundant data lines is selectively employed in place of a defective data line in one of said plurality of memory blocks;
data line selecting means for selectively coupling data lines of said plurality of memory blocks to corresponding ones of first common data lines in accordance with a first signal provided by a column decoder and for selectively coupling said redundant data lines to corresponding ones of redundant common data lines in accordance with a second signal provided by said column decoder;
a plurality of first latch circuits having respective inputs commonly coupled to one input terminal of said input terminals via a data input means and for latching said plurality of bits of data in sequence in accordance with a third signal provided by said column decoder;
second latch circuits having inputs respectively coupled to said one input terminal via said data input means and for latching predetermined bits of data of said plurality of bits of data in sequence in accordance with a fourth signal provided by said column decoder; and
a plurality of write amplifiers having inputs respectively coupled to outputs of corresponding ones of said first and second latch circuits and having outputs respectively coupled to said first common data lines and said redundant common data lines, said write amplifiers respectively transmitting bits of data latched in said first and second latch circuits to corresponding selected data lines and to corresponding selected redundant data lines when the selected data lines include a defective data line.

22. A semiconductor memory device according to claim 21, wherein said nonvolatile memory elements constitute an erasable and programmable read-only memory (EPROM) elements.

23. A semiconductor memory device according to claim 21, wherein said predetermined operation mode includes a page program mode of simultaneously writing data as bits of data, serially applied at one or more external terminals respectively associated with individual groups of memory blocks comprised from said plurality of memory blocks and said at least one redundant memory block, to corresponding first common data lines of individual memory blocks in each respective group thereof and is set by an output signal of a high voltage detector circuit, said high voltage detector circuit generating said output signal in response to a high input signal, applied to an external terminal of said semiconductor memory device, of a level exceeding a power source voltage associated with said device.

24. A semiconductor memory device according to claim 23, wherein the external terminal of said semiconductor device corresponds to one associated with an output enable signal ($\overline{OE}$) of the semiconductor device.

25. A semiconductor memory device according to claim 24, wherein said nonvolatile memory elements constitute erasable and programmable read-only memory (EPROM) elements.

26. A semiconductor memory device according to claim 25, wherein each block includes an arrangement of rows and columns of nonvolatile memory elements, each row and column of nonvolatile memory elements corresponding to a word and data line, respectively, and wherein each word line corresponds to a row of nonvolatile memory elements in each one of said plurality of blocks.

27. A semiconductor memory device according to claim 21, wherein said plurality of memory blocks include at least one memory array, coupled to a single external input/output terminal for serially receiving and outputting bits of data.

28. A semiconductor memory device according to claim 27, wherein said plurality of memory blocks comprise a plurality of memory arrays, each memory array corresponding to a group of memory blocks from said plurality of memory blocks, and wherein in each memory array there is included at least one redundant memory block, each redundant memory block having a redundant data line.

29. A semiconductor memory device according to claim 28, wherein each of said plurality of memory arrays respectively corresponds to a separate external input/output terminal where respective bits of data are serially inputted and outputted and which serially inputted bits of data are simultaneously applied to corresponding first common data lines of individual memory blocks in respective memory arrays, via corresponding latch circuits and write amplifiers, during a page program mode, corresponding to said predetermined operation mode, and which are serially applied to corresponding data lines selected during a normal program mode.

30. A semiconductor memory device according to claim 29, wherein said page program mode is set by an output signal of a high voltage detector circuit, said high voltage detector circuit generating said output signal in response to a high input signal, applied to an external terminal of said semiconductor memory device, of a level exceeding a power source voltage associated with said device.

31. A semiconductor memory device according to claim 30, wherein the external terminal of said semiconductor device corresponds to one associated with an output enable signal ($\overline{OE}$) of the semiconductor device.

32. A semiconductor memory device according to claim 31, wherein said page program mode is effected in response to the detection of said high input signal if a high writing voltage is being applied at a corresponding external terminal associated therewith and an external chip enable signal ($\overline{CE}$) is at a high logic level at another external terminal.

* * * * *